(12) United States Patent
Broderick et al.

(10) Patent No.: US 9,548,263 B2
(45) Date of Patent: Jan. 17, 2017

(54) SEMICONDUCTOR DEVICE PACKAGE FOR DEBUGGING AND RELATED FABRICATION METHODS

(71) Applicants: Damon Peter Broderick, Munich (DE); Dirk Heisswolf, Munich (DE); Andreas R. Pachl, Neubiberg (DE)

(72) Inventors: Damon Peter Broderick, Munich (DE); Dirk Heisswolf, Munich (DE); Andreas R. Pachl, Neubiberg (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/741,088

(22) Filed: Jun. 16, 2015

(65) Prior Publication Data

US 2016/0372405 A1  Dec. 22, 2016

(51) Int. Cl.
| | |
|---|---|
| H01L 23/495 | (2006.01) |
| H01L 23/00 | (2006.01) |
| H01L 23/31 | (2006.01) |
| H01L 21/56 | (2006.01) |

(52) U.S. Cl.
CPC ......... *H01L 23/49513* (2013.01); *H01L 21/56* (2013.01); *H01L 23/3114* (2013.01); *H01L 23/49517* (2013.01); *H01L 23/49541* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 2224/32245* (2013.01); *H01L 2224/48247* (2013.01); *H01L 2224/73265* (2013.01); *H01L 2224/8385* (2013.01); *H01L 2224/92247* (2013.01); *H01L 2924/14* (2013.01)

(58) Field of Classification Search
CPC ........ H01L 23/495; H01L 23/00; H01L 23/31; H01L 21/56
See application file for complete search history.

(56) References Cited

U.S. PATENT DOCUMENTS

| | | | | |
|---|---|---|---|---|
| 5,122,860 A | * | 6/1992 | Kikuchi | G06K 19/07745 257/679 |
| 5,250,841 A | * | 10/1993 | Sloan | H01L 22/32 257/48 |
| 6,818,973 B1 | * | 11/2004 | Foster | H01L 23/3107 257/668 |
| 7,496,813 B1 | * | 2/2009 | Houlihane | G01R 31/3172 702/190 |
| 8,384,168 B2 | | 2/2013 | Hooper et al. | |
| 2002/0053048 A1 | * | 5/2002 | Matsumoto | G01R 31/31709 714/100 |

* cited by examiner

*Primary Examiner* — Peniel M Gumedzoe

(57) ABSTRACT

Electronic device packages and related fabrication methods are provided. An exemplary electronic device includes a semiconductor die having debug circuitry fabricated thereon, a framing structure including an interior portion having the semiconductor die mounted thereto, and a conductive element providing an electrical connection between the interior portion and a contact pad on the semiconductor die that corresponds or is otherwise coupled to an interface of the debug circuitry.

17 Claims, 2 Drawing Sheets

SEMICONDUCTOR DEVICE PACKAGE FOR DEBUGGING AND RELATED FABRICATION METHODS

TECHNICAL FIELD

Embodiments of the subject matter described herein relate generally to electronic devices, and more particularly, to reduced pin count device packages that support debugging and related fabrication methods.

BACKGROUND

Many integrated circuit devices, such as microcontrollers, run program code that is stored internally "on chip." The complexity of the code for modern applications generally necessitates considerable code development, verification, and debugging. This lead time can be reduced through the use of on chip debug features, such as breakpoints, code tracing, code profiling, and the like to monitor code execution flow. Internal debug information may be supplied to an external application development tool using one or more package pins that are not used in the final application deployment. However, due to cost or size constraints, it is often not feasible to provide dedicated debugging pins. In cases where low pin count packages support debugging, the packages are usually limited to a single debug pin, which restricts the debugging capability because too few pins are available to support internal debug circuitry requiring multiple interface signals. Alternatively, internal debug information may be supplied using one or more package pins that are shared with application input/output (I/O) signals, but the functionality associated with those application I/O signals typically cannot be debugged because the shared pins cannot be used simultaneously for both debugging and application signals. In some situations, a vendor may offer a special larger pin count debug package which includes additional debug pins when the on chip application requires all of the pins supported by the application package. This may require an adaptor to mount the debug package to the application board, which, in turn, may not be feasible due to space constraints.

BRIEF DESCRIPTION OF THE DRAWINGS

The various embodiments will hereinafter be described in conjunction with the following drawing figures, which are not necessarily drawn to scale, wherein like numerals denote like elements, and wherein.

DETAILED DESCRIPTION

Embodiments of the present invention relate to electronic device packages that include interfaces to internal debug circuitry without increasing the device footprint or compromising the number of available interfaces to the internal functional circuitry. As described in greater detail below, the side (or surface) of the semiconductor die that is not mounted to the package substrate includes one or more interfaces to the debug circuitry fabricated on the die. An electrical connection is provided between the respective debug interfaces and a portion of the underlying package substrate, which, in turn, may then be utilized as an interface to the internal debug circuitry. In exemplary embodiments, the opposing side of the semiconductor die that is mounted to the package substrate is affixed or otherwise joined using an insulating adhesive material that electrically isolates or insulates the die from the package substrate. An encapsulating material may also be formed overlying the semiconductor die and the package substrate, and the encapsulating material may physically and electrically isolate the debug circuitry from the package interfaces to be used for the functional circuitry.

In exemplary embodiments, the package substrate is a framing structure, such as a lead frame structure or the like, that supports the overlying components of the device package and includes package interfaces for the internal functional circuitry. In this regard, the portion of the framing structure to which the die is mounted may be inwardly offset from the perimeter or periphery of the framing structure where the package interfaces are located. For example, the functional circuitry on the die may be electrically connected to the leads about the perimeter of a lead frame structure using wire bonds or other suitable conductive elements, while the die is mounted to the interior portion of the lead frame structure. In exemplary embodiments, the lateral area of the die is less than the lateral area of the underlying interior mounting portion, so that the die does not overlie a portion of the interior mounting portion that is used for providing an electrical connection to the debug circuitry. In this regard, a wire bond or other suitable conductive element may be provided between the accessible bonding portion of the interior mounting portion and the interface to/from the debug circuitry on the die. Thereafter, the interior mounting portion may be utilized as an interface to the debug circuitry on the die. As described in greater detail below, to support multiple interfaces to the debug circuitry, the interior mounting portion may be subdivided in to multiple discrete portions, which, in turn, are electrically connected to different interfaces of the internal debug circuitry.

Figure 1:
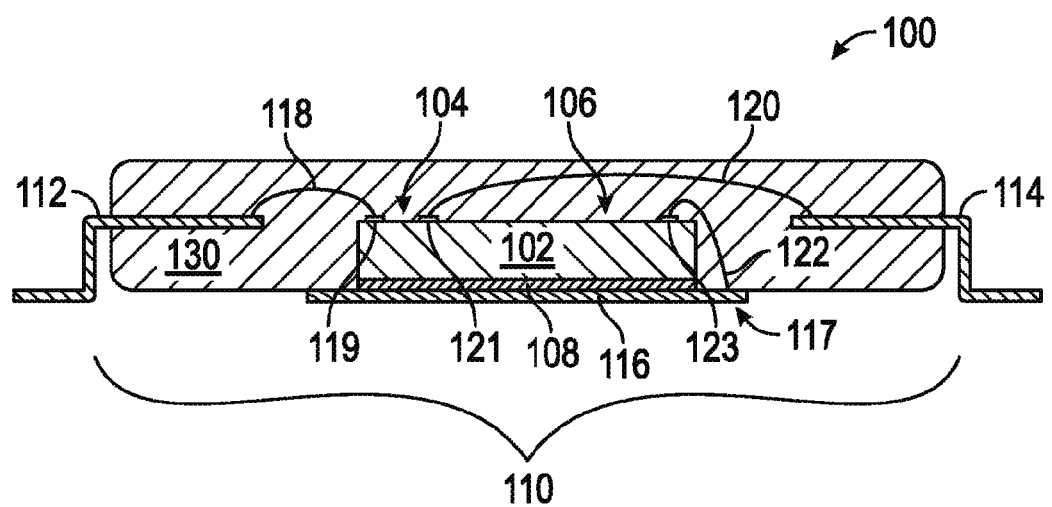
FIG. 1 depicts a cross-sectional view of an exemplary electronic device package in accordance with one embodiment of the invention.

Turning now to FIG. 1, an exemplary electronic device package 100 includes at least one semiconductor die 102 having both functional circuitry and debug circuitry formed, fabricated, or otherwise provided thereon. In this regard, various well known semiconductor device fabrication processes may be performed to fabricate semiconductor electrical components in or on a surface of a semiconductor substrate (or wafer) and form electrical interconnections among those components before dicing or otherwise singulating the substrate to obtain the instance of die 102. Functional circuitry supporting the operation of the electronic device 100 may be fabricated on a first region 104 of the die 102, while the debug circuitry coupled to the functional circuitry to support debugging the operation of the functional circuitry may be fabricated on a second region 106 of the die 102. In exemplary embodiments, the electronic device 100 can be realized as a microcontroller or an application specific integrated circuit, where the functional circuitry can include a processing core or other processing logic, one or more memories or other data storage elements associated therewith, or any suitable combination thereof to provide the desired functionality for the end application. It should be noted that although not illustrated in FIG. 1, in practical embodiments, the device package 100 may include additional dies arranged within the device package 100 in any number of possible configurations or arrangements, and the subject matter described herein is not limited to the depiction in FIG. 1.

The electronic device 100 includes a conductive framing structure 110 including package interface portions 112, 114 and an interior mounting portion 116. The package interface portions 112, 114 function as the physical input/output interfaces to/from the circuitry on the die 102 that is mounted on the interior mounting portion 116 and encapsulated in the electronic device package 100. Depending on the embodiment, each of the package interfaces 112, 114 may be realized as an individual pin, lead, terminal, or another suitable physical interface to the electronic device 100. In exemplary embodiments described herein, the framing structure 110 is realized as a lead frame structure, where the package interface portions 112, 114 are realized as the leads of the lead frame structure 110 and the interior mounting portion 116 is realized as the lead frame pad (also referred to as the flag) of the lead frame structure 110.

In exemplary embodiments, the backside surface of the semiconductor die 102 is affixed, bonded, or otherwise joined to the lead frame pad 116 using an adhesive material 108, such as an epoxy or silicone adhesive. In one or more embodiments, the adhesive material 108 is realized as an electrically-insulating adhesive, such as an insulating epoxy, that provides electrical isolation between the conductive lead frame pad 116 and the backside of the die 102, but can still provide thermal conductivity. The insulating adhesive material 108 isolates the lead frame pad 116 from the body of the semiconductor die 102, which, in some embodiments, may have a low resistance connection to the internal ground for the functional circuitry on the die 102. In exemplary embodiments, the lateral area of the lead frame pad 116 is greater than the lateral area of the semiconductor die 102 (or alternatively, the maximum area of the die 102 is less than the area of the lead frame pad 116) to provide an accessible portion 117 of the lead frame pad 116. In other words, an edge of the die 102 is inwardly offset from an edge of the lead frame pad 116 after the die 102 is mounted to the lead frame pad 116 to provide the accessible portion 117 at or near a periphery of the lead frame pad 116 that is exposed, uncovered, or otherwise does not underlie the die 102.

The topside surface of the semiconductor die 102 includes conductive bondable contact pads (or die pads) that function as input/output terminals for providing or receiving electrical signals to/from the circuitry fabricated on the die 102. After mounting the semiconductor die 102 to the lead frame pad 116 of the lead frame structure 110, conductive elements 118, 120, such as wire bonds, are formed between the bondable die pad(s) 119, 121 on the topside surface of the die 102 that are coupled to the inputs and/or outputs (I/Os) of the functional circuitry on the die 102 and corresponding leads 112, 114 of the device package 100 to provide externally-accessible electrical connections to the functional circuitry on the die 102. At the same time, one or more conductive elements 122 are formed between the bondable die pad(s) 123 on the topside surface of the die 102 that are coupled to the I/Os of the debug circuitry on the die 102 and the accessible bonding portion 117 of the lead frame pad 116. In this manner, the lead frame pad 116 may be utilized to provide externally-accessible electrical connections to the debug circuitry on the die 102.

In alternative embodiments, conductive element(s) 122 may provide an electrical connection from the debug circuitry to an intermediate metal conducting plane circumscribing the lead frame pad 116, with the intermediate metal conducting plane being electrically connected to the exposed portion 117 of the lead frame pad 116, for example, via additional wire bonds down to the lead frame pad 116 or interconnecting conductive material (e.g., metal bars between the conducting plane and the lead frame pad 116 that are uniformly distributed about the perimeter of the lead frame pad 116). For example, the lead frame structure may include a ring of conductive material that laterally circumscribes the lead frame pad 116 and is disposed laterally between the lead frame pad 116 and the leads 112, 114, with the conductive ring being electrically connected to both the debug pad 123 on the topside surface of the die 102 and to the exposed portion 117 of the lead frame pad 116 so that the debug circuitry is electrically connected to the lead frame pad 116 via the conductive ring.

After affixing the die 102 to the lead frame pad 116 and forming the wire bonds 118, 120, 122, fabrication of the device package 100 continues by forming an encapsulating material 130, such as a thermosetting epoxy molding compound or other molding material, overlying the die 102, the lead frame pad 116, and the wire bonds 118, 120, 122 to encapsulate the die 102 and the wire bonds 118, 120, 122. The molding compound 130 fills any spaces between the die 102 and the lead frame structure 110 and protects the wire bonds 118, 120, 122 as well as the circuitry and/or components on the topside surface of the die 102 from environmental elements. In this manner, the molding compound 130 may reside laterally between the debug wire bond(s) 122 and/or the lead frame pad 116 and one or more of the leads 112, 114 to physically and electrically isolate the respective lead(s) 112, 114 from the debug wire bond(s) 122 and/or the lead frame pad 116. Thus, the debug circuitry is neither physically nor electrically connected to any of the package interfaces 112, 114.

For application deployments of the electronic device 100, the lead frame pad 116 may be primarily utilized for heat transfer to conduct heat away from the die 102 and/or the device package 100, for example, when functional circuitry on the die 102 provides higher current analog features or functionality that were traditionally supported by dedicated analog devices on the circuit board or electronics substrate to which the device 100 is mounted. In addition, for debugging purposes, the lead frame pad 116 may be utilized as an interface to the debug circuitry on the die 102. For example, at least the portion 117 of the lead frame pad 116 may be soldered to a metal area or other bonding location on a debug electronics substrate that includes metal traces, routing, or any other suitable electrical interconnects to provide an electrical connection from the lead frame pad 116 to a computing device executing, implementing, or otherwise functioning as a debugger (or alternatively, a debug probe). Thus, the lead frame pad 116 effectively provides an additional pin for debugging without increasing the pin count or the footprint of the device package 100, and without inhibiting the heat transfer characteristics of the lead frame pad 116 during application deployment. The exposed portion 117 of the lead frame pad 116 provides a bidirectional interface together with the debug controller and/or other debug module circuitry 106 fabricated on the semiconductor die 102. The external debugger allows monitoring of internal code flow being executed by the microcontroller circuitry 104 on the die 102 using breakpoints, code tracing, code stepping and other operations, as will be appreciated in the art.

In one or more embodiments, the exposed portion 117 of the lead frame pad 116 may be utilized as a debug profiling interface which provides an encoded, compressed profile of the code execution flow during run time. In such embodiments, during run time, code flow information (e.g., change of flow (COF) program counter addresses) is gathered from the functional circuitry 104 and stored temporarily in internal memory elements of the on chip debug circuitry 106. After an entire debugging record has been written to the memory of the debug circuitry 106, the record is transmitted to the external debugger via the debug profiling interface provided by the conductive element 122 and the exposed die portion 117 until a breakpoint occurs. The external debugger may then utilize the profiling information to reconstruct the code flow for debugging or profiling the application implemented by the functional circuitry 104. In the embodiment of FIG. 1 where the profiling interface utilizes a single debug I/O pad, the transmitted profiling information includes both data and clock information (e.g. Manchester coding).

Figure 2:
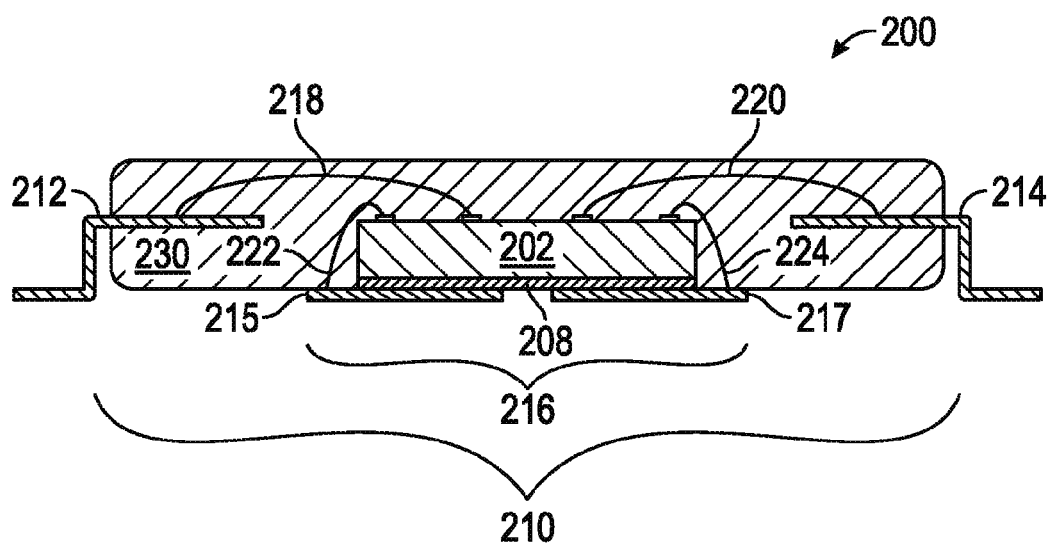
FIG. 2 depicts a cross-sectional view of an exemplary electronic device package in accordance with another embodiment of the invention.

FIG. 2 depicts another embodiment of an electronic device package 200 that utilizes a lead frame structure 210 to provide a plurality of physical input/output interfaces to/from the debug circuitry on the die 202 that is mounted on the die pad 216 of the lead frame structure 210. In this regard, in the embodiment of FIG. 2, the die pad 216 is divided into electrically isolated and distinct mounting portions 215, 217 that are electrically connected to different debug contact pads on the die 202. The divided pad 216 effectively provides multiple additional pins as needed for debugging without increasing the pin count or the footprint of the device package 200. For example, a first die flag portion 215 may be utilized to provide a debug clock signal while the second die flag portion 217 is utilized to provide a debug data signal. It will be appreciated that using multiple debug interfaces enhances debug capability in cases where the debug clock signal frequency may vary due to device clock frequency variations. Moreover, it should be noted that FIG. 2 depicts merely one simplified representation of an exemplary device package 200 with multiple die flag portions 215, 217, and in practice, the die flag of a lead frame may be portioned into any number or configuration of subdivided portions as desired for the particular debugging scheme and as allowed by the particular packaging technology being utilized.

In a similar manner as described above, the conductive lead frame structure 210 includes package interface portions 212, 214 that function as the physical I/O interfaces for the functional circuitry fabricated on the die 202. Again, the topside surface of the semiconductor die 202 includes conductive contact pads (or die pads), with conductive wire bonds 218, 220 being formed between the contact pads corresponding to the functional circuitry I/Os and the corresponding package leads 212, 214, while conductive wire bonds 222, 224 are formed between the contact pads corresponding to the debug circuitry and the respective flag portions 215, 217. For example, wire bond 222 may provide an electrical connection from the debug clock signal contact pad to the first flag portion 215, while wire bond 224 provides an electrical connection from the debug data signal contact pad to the second flag portion 217. In a similar manner as described above, at least a portion of each of the divided flag portions 215, 217 extends laterally beyond an edge of the die 202 after mounting to provide an accessible bonding area for one end of the debug wire bonds 222, 224.

After affixing the die 202 to the die flag 216 and forming the wire bonds 218, 220, 222, 224, fabrication of the device package 200 continues by forming an encapsulating material 230 that encapsulates the die 202 and the wire bonds 218, 220, 222, 224. In some embodiments, depending on the partitioning of the die flag 216, one or more tie bars or other supporting structures may be provided to mechanically support the divided flag portions 215, 217. For debugging purposes, the device package 200 may then be mounted to a circuit board or other electronics substrate that includes different metal traces or routing for each of the respective die flag portions 215, 217 to provide electrical connections from the die pad 216 for the different debug signals to an external debugger.

Referring now to both FIGS. 1-2, in embodiments where the functional circuitry in the final application deployment requires the die pad to be grounded, different or separate bond outs can be used for the final application deployments versus those used for the debug deployments. In this regard, one or more additional wire bond(s) may be provided from the die pad to the ground contact pad(s) for the functional circuitry on the topside of the die. In this regard, for the application device packages 100, 200, an electrically conductive adhesive material 108, 208 may alternatively be used to mount the die 102, 202 to the lead frame pad 116, 216. However, at least the debug device packages 100, 200 (e.g., the chips used for debugging) utilize an electrically insulating adhesive material 108, 208 to mount the die 102, 202 to the lead frame pad 116, 216. Thus, both the application and debug device packages may have the same package layout, outline, and footprint, thereby removing the need for any adaptors or otherwise supporting different packages for the same application.

Referring again to FIG. 2, in some embodiments, the lead frame pad 216 may be subdivided into one or more additional divided flag portions (not illustrated) that are electrically connected to a corresponding ground contact pad on the topside of the die 202 for the functional circuitry via a wire bond, with that divided flag portion being grounded by the electronics substrate or circuit board that an application device package 200 is mounted to. In such embodiments, an electrically insulating adhesive material 208 may be utilized by virtue of the wire bonds providing an electrical connection from the functional circuitry ground pads to the application ground on the electronics substrate via the respective divided flag portion(s). In order to use the same electronics substrate for both bond out options, the divided flag portions 215, 217 may be short-circuited with those used for the ground contact pads of the functional circuitry using a single solder connection, while individual and separate solder connections may be utilized for each divided flag portion 215, 217 of the lead frame pad 216. The debug signals may be configured to be high impedance inputs by default, so the short circuit to ground does not impact the performance of the application devices 200. Alternatively, the debug signal flag portions 215, 217 can remain electrically isolated from ground but be connected to a separate metal trace on the electronics substrate better thermal performance.

Figure 3:
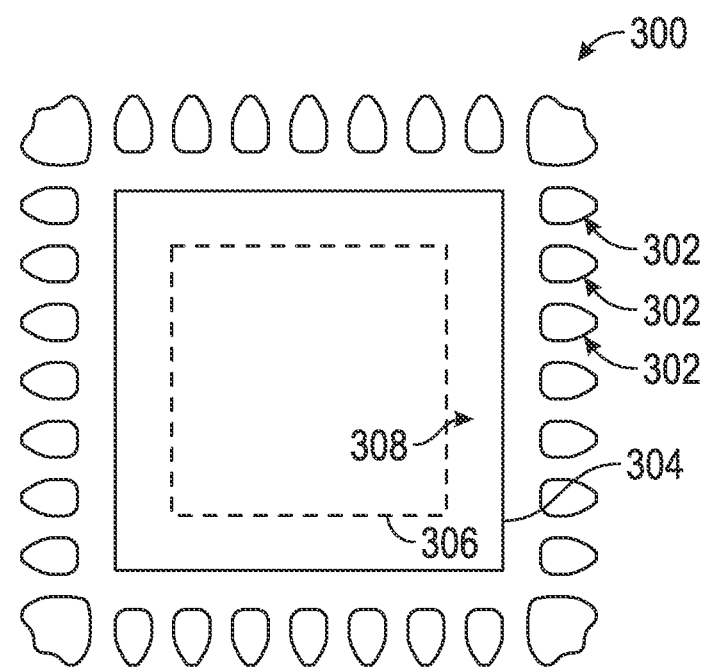
FIG. 3 depicts a top view of a framing structure suitable for use with the electronic device package of FIG. 1.

FIG. 3 depicts a top view of a framing structure 300 suitable for use as the framing structure 110 in the electronic device 100 of FIG. 1. The illustrated framing structure 300 depicts a lead frame structure with package interfaces (or leads) 302 about the perimeter of the lead frame structure that circumscribe an interior mounting portion (or pad) 304. FIG. 3 depicts an inner region 306 where a semiconductor die (e.g., die 102) can be mounted to the pad portion 304, with at least one edge of the semiconductor die (or alternatively, the corresponding die mounting region 306) being inwardly offset from the perimeter of the pad portion 304 to expose a peripheral portion 308 of the pad 304. The exposed portion 308 of the pad 304 may then be electrically connected to a debug interface on the semiconductor die via wire bonding, or the like, as described above. It should be noted that although FIG. 3 depicts the lateral area of the die (e.g., region 306 corresponding to the die footprint) being encompassed by the lateral area of the die pad portion 304 with the lateral dimensions of the die being less than the corresponding lateral dimensions of the die pad portion 304, the subject matter described herein is not limited to any particular area or configuration of the die with respect to the die pad. For example, a first dimension of the semiconductor die in a first direction may be greater than the corresponding dimension of the die pad in that direction, while a second dimension of the semiconductor die in an orthogonal direction is less than the corresponding dimension of the die pad in that orthogonal direction. In other words, regardless of the dimension of the die or the die pad relative to one another, the subject matter described herein may be employed whenever at least a portion of the semiconductor die overlaps at least a portion of the die pad for mounting while at least a portion of the die pad is maintained exposed for providing a connection to a debug interface on the semiconductor die.

Figure 4:
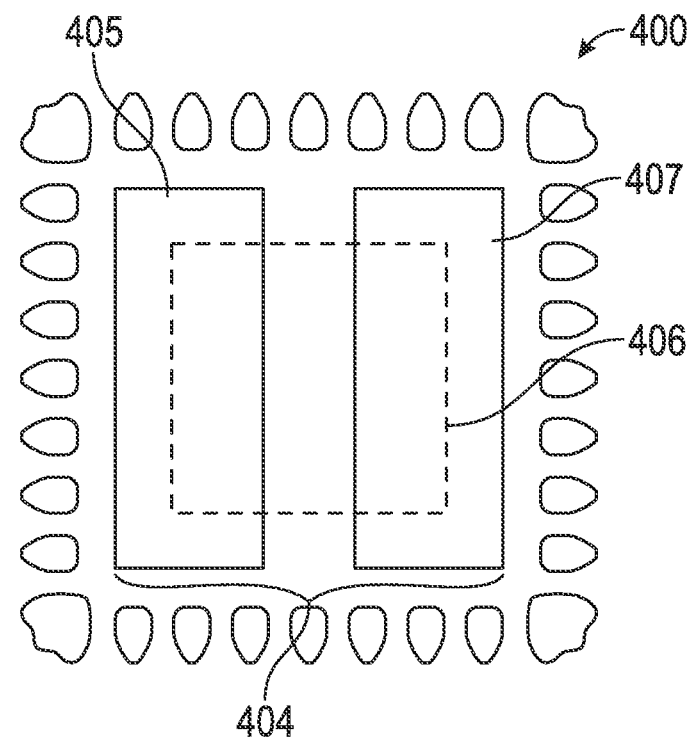
FIG. 4 depicts a top view of a framing structure suitable for use with the electronic device package of FIG. 2.

Similarly, FIG. 4 depicts a top view of a framing structure 400 suitable for use as the framing structure 210 in the electronic device 200 of FIG. 1. The illustrated framing structure 400 depicts pad portion 404 that is subdivided into separate flag portions 405, 407, with at least one edge of the semiconductor die (or die mounting region 406) being inwardly offset from a respective perimeters of a respective flag portions 405, 407 to expose portions of the flag portions 405, 407, which may then be electrically connected to debug interfaces on the semiconductor die via wire bonding, or the like, as described above.

For the sake of brevity, conventional techniques related to semiconductor and/or integrated circuit fabrication, device packaging, debugging, and other functional aspects of the subject matter may not be described in detail herein. In addition, certain terminology may be used herein for the purpose of reference only, and thus are not intended to be limiting. For example, the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

An apparatus for an electronic device is provided in one embodiment. The electronic device comprises a semiconductor die having debug circuitry fabricated thereon, the semiconductor die comprising a contact pad coupled to the debug circuitry, a framing structure including an interior portion having the semiconductor die mounted thereto, and a conductive element providing an electrical connection between the contact pad and the interior portion. In one embodiment, a lateral area of the semiconductor die is less than a lateral area of the interior portion. In another embodiment, an edge of the semiconductor die is inwardly offset from an edge of the interior portion, and the conductive element provides the electrical connection from the contact pad to an accessible portion of the interior portion between the edge of the semiconductor die and the edge of the interior portion. In yet another embodiment, the edge of the interior portion is inwardly offset from a periphery of the framing structure. In another embodiment, the electronic device further comprises an electrically-insulating adhesive material joining the semiconductor die to the interior portion. In yet another embodiment, the semiconductor die exposes a bonding portion of the interior portion, and the conductive element comprises a wire bond between the bonding portion and the contact pad. In another embodiment, the electronic device further comprises a second conductive element, wherein the semiconductor die includes a second contact pad coupled to the debug circuitry, the framing structure includes a second mounting portion having the semiconductor die mounted thereto, and the second conductive element provides a second electrical connection between the second contact pad and the second mounting portion. In one embodiment, the contact pad receives a clock signal from the debug circuitry and the second contact pad receives a data signal from the debug circuitry. In another embodiment, the electronic device further comprises functional circuitry fabricated on the semiconductor die, wherein the debug circuitry is coupled to the functional circuitry to provide an output signal at the contact pad that is influenced by operation of the functional circuitry. In a further embodiment, the framing structure includes one or more package interface elements electrically connected to the functional circuitry fabricated on the semiconductor die and electrically isolated from the debug circuitry.

In another exemplary embodiment, an apparatus for a semiconductor device package is provided. The semiconductor device package comprises a semiconductor die having functional circuitry and debug circuitry fabricated thereon, the debug circuitry being coupled to the functional circuitry, and configured to debug the functional circuitry, wherein the semiconductor die comprises a contact pad coupled to the debug circuitry, a lead frame structure comprising one or more leads coupled to the functional circuitry and a pad portion having the semiconductor die mounted thereto, and a conductive element configured to provide an electrical connection between the contact pad and the pad portion. In one embodiment, the one or more leads are disposed about a perimeter of the lead frame structure, and the pad portion is inwardly offset from the perimeter of the lead frame structure. In a further embodiment, a lateral area of the semiconductor die is less than a lateral area of the pad portion. In another embodiment, the semiconductor device package further comprises an electrically-insulating adhesive material affixing the semiconductor die to the pad portion. In yet another embodiment, the semiconductor device package further comprises a second conductive element providing a second electrical connection between a ground contact pad for the functional circuitry and the pad portion. In another embodiment, the semiconductor device package further comprises a second conductive element, wherein the lead frame structure includes a second pad portion having the semiconductor die mounted thereto and the second conductive element provides a second electrical connection between a second contact pad coupled to the debug circuitry and the second pad portion. In another embodiment, the semiconductor device package further comprises an encapsulating material overlying the semiconductor die and the conductive element and electrically isolating the conductive element from the one or more leads.

In another embodiment, an exemplary method of fabricating an electronic device is provided. The method comprises mounting a semiconductor die to an interior portion of a framing structure using an electrically-insulating adhesive material, wherein the semiconductor die comprises functional circuitry and debug circuitry fabricated thereon, and the debug circuitry is coupled to the functional circuitry and configured to debug the functional circuitry. The method further comprises providing an electrical connection between the debug circuitry and the interior portion. In one embodiment, the method further comprises forming an encapsulating material overlying the semiconductor die and electrically isolating one or more package interfaces for the electronic device from the debug circuitry. In another embodiment, providing the electrical connection comprises forming a wire bond between a contact pad on the semiconductor die and an accessible portion of the interior portion.

The foregoing detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. An electronic device comprising:
a semiconductor die having debug circuitry fabricated thereon, the semiconductor die comprising a contact pad coupled to the debug circuitry;
a framing structure including a package interface portion and an interior portion, the interior portion having an edge inwardly offset from the package interface portion and the interior portion having the semiconductor die mounted thereto, wherein an edge of the semiconductor die is inwardly offset from the edge of the interior portion; and
a conductive element providing an electrical connection between the contact pad and an accessible portion of the interior portion between the edge of the semiconductor die and the edge of the interior portion.

2. The electronic device of claim 1, wherein a lateral area of the semiconductor die is less than a lateral area of the interior portion.

3. The electronic device of claim 1, wherein the edge of the interior portion is inwardly offset from a periphery of the framing structure.

4. The electronic device of claim 1, further comprising an electrically-insulating adhesive material joining the semiconductor die to the interior portion.

5. The electronic device of claim 1, wherein:
the semiconductor die exposes a bonding portion of the interior portion; and
the conductive element comprises a wire bond between the bonding portion and the contact pad.

6. The electronic device of claim 1, further comprising a second conductive element, wherein:
the semiconductor die includes a second contact pad coupled to the debug circuitry;
the framing structure includes a second mounting portion having the semiconductor die mounted thereto; and
the second conductive element provides a second electrical connection between the second contact pad and the second mounting portion.

7. The electronic device of claim 6, wherein the contact pad receives a clock signal from the debug circuitry and the second contact pad receives a data signal from the debug circuitry.

8. The electronic device of claim 1, further comprising functional circuitry fabricated on the semiconductor die, wherein the debug circuitry is coupled to the functional circuitry to provide an output signal at the contact pad that is influenced by operation of the functional circuitry.

9. The electronic device of claim 8, wherein the framing structure includes one or more package interface elements electrically connected to the functional circuitry fabricated on the semiconductor die and electrically isolated from the debug circuitry.

10. A semiconductor device package comprising:
a semiconductor die having functional circuitry and debug circuitry fabricated thereon, the debug circuitry being coupled to the functional circuitry, and configured to debug the functional circuitry, wherein the semiconductor die comprises a contact pad coupled to the debug circuitry;
a lead frame structure comprising one or more leads coupled to the functional circuitry and a pad portion having the semiconductor die mounted thereto, wherein the one or more leads are disposed about a perimeter of the lead frame structure and the pad portion is inwardly offset from the one or more leads of the lead frame structure; and
a conductive element configured to provide an electrical connection between the contact pad and the pad portion.

11. The semiconductor device package of claim 10, wherein a lateral area of the semiconductor die is less than a lateral area of the pad portion.

12. The semiconductor device package of claim 10 further comprising an electrically-insulating adhesive material affixing the semiconductor die to the pad portion.

13. The semiconductor device package of claim 10, further comprising a second conductive element providing a second electrical connection between a ground contact pad for the functional circuitry and the pad portion.

14. The semiconductor device package of claim 10, further comprising a second conductive element, wherein the lead frame structure includes a second pad portion having the semiconductor die mounted thereto and the second conductive element provides a second electrical connection between a second contact pad coupled to the debug circuitry and the second pad portion.

15. The semiconductor device package of claim 10, further comprising an encapsulating material overlying the semiconductor die and the conductive element, the encapsulating material electrically isolating the conductive element from the one or more leads.

16. A method of fabricating an electronic device, the method comprising:
   mounting a semiconductor die to an interior mounting portion of a framing structure inwardly offset from a package interface portion of the framing structure using an electrically-insulating adhesive material, wherein:
      the semiconductor die comprises functional circuitry and debug circuitry fabricated thereon, and
      the debug circuitry is coupled to the functional circuitry and configured to debug the functional circuitry; and
   providing a wire bond between a contact pad on the semiconductor die coupled to the debug circuitry and the interior mounting portion.

17. The method of claim 16, further comprising forming an encapsulating material overlying the semiconductor die and electrically isolating one or more package interfaces for the electronic device from the debug circuitry.

* * * * *